United States Patent
Cheng et al.

(10) Patent No.: US 12,089,506 B2
(45) Date of Patent: Sep. 10, 2024

(54) TARGET FOR MRAM

(71) Applicant: Taiwan Semiconductor Manufacturing Company, Ltd., Hsinchu (TW)

(72) Inventors: Wen-Hao Cheng, Taichung (TW); Hsuan-Chih Chu, Changhua County (TW); Yen-Yu Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 417 days.

(21) Appl. No.: 17/578,347

(22) Filed: Jan. 18, 2022

(65) Prior Publication Data

US 2023/0008029 A1    Jan. 12, 2023

Related U.S. Application Data

(60) Provisional application No. 63/220,418, filed on Jul. 9, 2021.

(51) Int. Cl.
| | |
|---|---|
| *H01L 43/02* | (2006.01) |
| *C23C 14/34* | (2006.01) |
| *H10N 50/01* | (2023.01) |
| *H10N 50/80* | (2023.01) |

(52) U.S. Cl.
CPC ......... *H10N 50/80* (2023.02); *C23C 14/3407* (2013.01); *H10N 50/01* (2023.02)

(58) Field of Classification Search
CPC ... C23C 14/067; C23C 14/3407; H10B 61/00; H10N 50/01; H10N 50/80
See application file for complete search history.

(56) References Cited

U.S. PATENT DOCUMENTS

| | | | |
|---|---|---|---|
| 2006/0137969 A1* | 6/2006 | Feldewerth | H01J 37/3429 204/192.15 |
| 2023/0220538 A1* | 7/2023 | Hara | B22F 1/12 204/298.13 |

* cited by examiner

*Primary Examiner* — Jaehwan Oh
(74) *Attorney, Agent, or Firm* — Kilpatrick Townsend & Stockton LLP (57) ABSTRACT

A sputtering target structure includes a back plate characterized by a first size, and a plurality of sub-targets bonded to the back plate. Each of the sub-targets is characterized by a size that is a fraction of the first size and is equal to or less than a threshold target size. Each sub-target includes a ferromagnetic material containing iron (Fe) and boron (B). Each of the plurality of sub-targets is in direct contact with one or more adjacent sub-targets.

20 Claims, 8 Drawing Sheets

TARGET FOR MRAM

PRIORITY CLAIM AND CROSS-REFERENCE

The present application claims priority to U.S. Provisional Patent Application No. 63/220,418, filed on Jul. 9, 2021, and entitled "A Novel Target For MRAM," the entire disclosure of which is incorporated herein by reference.

BACKGROUND

Many electronic devices rely on magnetoresistive random access memory (MRAM) as embedded memory. MRAM is also used to replace other conventional memories, such as static RAM (SRAM) and dynamic RAM (DRAM) in many electronic devices. The MRAM cell includes a magnetic tunnel junction (MTJ), which functions as a magnetic memory cell.

In MRAM processing, a physical vapor deposition (PVD) process, also known as a sputter deposition or sputtering, deposits thin films by using energetic particles to bombard a target source into the gas phase and onto a substrate, e.g., a silicon wafer. Traditional sputtering targets are often not satisfactory, as explained below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In certain embodiments of MRAM, the magnetic memory cell includes ferromagnetic alloy having cobalt (Co), iron (Fe), and boron (B), e.g., cobalt-iron-boron (CoFeB) or CoFeX, where X can be boron (B), carbon (C), or aluminum (Al), etc. In some embodiments, the magnetic memory cell includes cobalt-iron-tantalum alloy (CoFeTa), nickel iron (NiFe), Co, CoFe, cobalt platinum (CoPt), or other alloys of nickel (Ni), Co, and Fe, etc. An exemplary formation method includes sputtering, PVD, atomic layer deposition (ALD), e-beam or thermal evaporation, or the like. In a sputtering or PVD system, the sputtering targets provide the source materials mentioned above. Depending on the application, the sputtering targets also provide source materials for metals or metal alloys used in interconnect structures, for example, aluminum (Al), copper (Cu), and titanium nitride (TiN), etc.

In some embodiments, the core magnetic films forming magnetic tunnel junctions in MRAM and Spin-transfer torque magnetic random-access memory (STTRAM) are made of cobalt-iron-boron (CoFeB) alloys with high boron content, or other suitable materials. However, CoFeB alloys are brittle and susceptible to cracking, especially with high boron content CoFeB alloys, for example, the sputtering targets exhibiting a boron (B) content of greater than 15%, or 20%, or more.

Traditional sputtering targets are often made into one single piece of materials with a single top surface, and they are susceptible to cracking under stress. Such cracking in the sputtering target can result in undesirable particle generation during the sputtering process, causing contamination and defects. Some embodiments provide a method for forming sputtering targets and new target structures that can reduce or eliminate sputtering target cracking.

Figure 1:
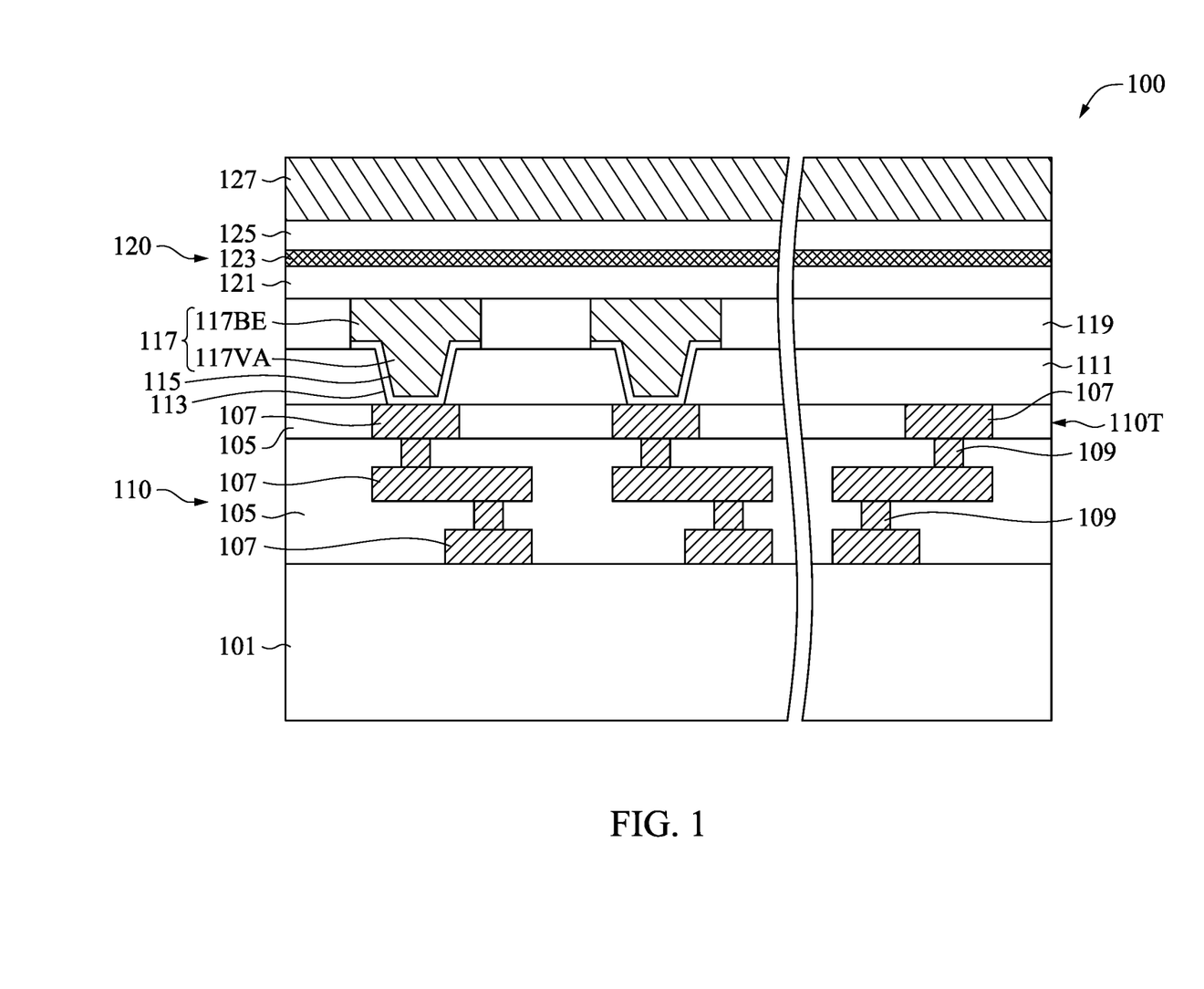
FIG. 1 is a simplified cross-sectional view of an intermediate device structure during formation of a magnetic random access memory (MRAM) device, in accordance with some embodiments.

FIG. 1 is a simplified cross-sectional view of an intermediate device structure during formation of a magnetic random access memory (MRAM) device, in accordance with some embodiments. As shown in FIG. 1, intermediate device structure 100 shows part of a semiconductor wafer, which includes a substrate 101. A lower interconnect structure 110 is formed on the substrate 101. The lower interconnect structure 110 includes multiple intermetal dielectric (IMD) layers 105, multiple metal lines 107, and multiple conductive vias 109. The metal lines 107 and the conductive vias 109 are embedded in the IMD layers 105. There are multiple contacts (not shown) formed between the lower interconnect structure 110 and the substrate 101 to be electrically coupled to the various functional elements formed on and/or in the substrate 101. In addition, the lower interconnect structure 110 includes an uppermost interconnect layer 110T that includes an uppermost IMD layer 105 and multiple uppermost metal lines 107 embedded in the uppermost IMD layer 105. The metal lines 107 of the same interconnect layer are disposed in the same IMD layer 105 to provide a horizontal electrical connection for various elements of integrated circuits (ICs). The conductive vias 109 in the same IMD layer 105 are disposed between two metal lines 107 to provide a vertical electrical connection.

Still referring to FIG. 1, an interlayer dielectric (ILD) layer 111 is deposited on the uppermost interconnect layer 110T in accordance with some embodiments. A barrier layer 115 is deposited on the ILD layer 111 and in the via holes 113, and a conductive material layer 117 is deposited on the barrier layer 115. The conductive material layer 117 and the barrier layer 115 are patterned together to form multiple bottom electrodes 117BE and multiple bottom electrode vias 117VA in accordance with some embodiments. An etch stop layer 119 is deposited on the ILD layer 111 to surround the bottom electrodes 117BE in accordance with some embodiments.

As shown in FIG. 1, a magnetic tunnel junction (MTJ) structure 120 is deposited on the bottom electrodes 117BE and the etch stop layer 119, and then a top electrode material layer 127 is deposited on the MTJ structure 120 in accordance with some embodiments. According to embodiments of the disclosure, the conductive material layer 117 is patterned to form the bottom electrodes 117BE before depositing MTJ structure 120. The MTJ structure 120 includes a first ferromagnetic layer 121 arranged over the bottom electrodes 117BE and the etch stop layer 119, an insulating barrier layer 123 arranged over the first ferromagnetic layer 121, and a second ferromagnetic layer 125 arranged over the insulating barrier layer 123. In some embodiments, the first ferromagnetic layer 121 is a pinned layer, and the second ferromagnetic layer 125 is a free layer. In this case, an anti-ferromagnetic (AFM) layer (not shown) is arranged under the first ferromagnetic layer 121 and above the bottom electrodes 117BE and the etch stop layer 119.

In some other embodiments, the first ferromagnetic layer 121 is a free layer, and the second ferromagnetic layer 125 is a pinned layer. In this case, an AFM layer (not shown) is arranged under the second ferromagnetic layer 125 and above the insulating barrier layer 123.

The AFM layer may be made of platinum manganese (PtMn), iridium manganese (IrMn), rhodium manganese (RhMn) or iron manganese (FeMn). The ferromagnetic layer arranged on the AFM layer can be used as a pinned layer due to the magnetic moment of the pinned layer that is pinned in a particular direction by the AFM layer. The AFM layer may be deposited using various deposition processes such as a chemical vapor deposition (CVD), PVD, or ALD process. The AFM layer may have a thickness in a range from about 80 Å to about 200 Å.

The pinned layer of the MTJ structure is configured to not change its magnetic moment during operation of the MRAM cells. The pinned layer such as the first ferromagnetic layer 121 or the second ferromagnetic layer 125 may be made of CoFeB, CoFeTa, NiFe, Co, CoFe, CoPt, CoPd, FePt, Ru, or other alloys of Ni, Co and Fe. The pinned layer may be deposited using various deposition processes such as a CVD, PVD, or ALD process. In some examples, the pinned layer may have a thickness in a range from about 30 Å to about 100 Å.

Unlike the pinned layer, the magnetic moment direction of the free layer of the MTJ structure is configured to change under various conditions during operation of the MRAM cells because there is no AFM layer adjacent to the free layer. The free layer such as the first ferromagnetic layer 121 or the second ferromagnetic layer 125 is also made of a ferromagnetic material, for example CoFeB, CoFeTa, NiFe, Co, CoFe, CoPt, CoPd, FePt, Ru, or other alloys of Ni, Co and Fe. The free layer may be deposited using various deposition processes such as CVD, PVD, or ALD processes. In some examples, the free layer may have a thickness in a range from about 10 Å to about 30 Å.

The insulating barrier layer 123 may be made of a dielectric material, such as magnesium oxide (MgO), aluminum oxide (AlOx or $Al_2O_3$), aluminum nitride (AlN), aluminum oxynitride (AlON), other suitable materials, or a combination thereof. The insulating barrier layer 123 may be deposited using various deposition processes such as CVD, PVD, or ALD process. In some examples, the insulating barrier layer 123 may have a thickness in a range from about 1 Å to about 50 Å.

The top electrode material layer 127 is deposited on the second ferromagnetic layer 125, as shown in FIG. 1 in accordance with some embodiments. The top electrode material layer 127 may be made of a conductive material, such as tantalum (Ta), tantalum nitride (TaN), titanium (Ti), titanium nitride (TiN), copper (Cu), cobalt (Co), tungsten (W), aluminum (Al), gold (Au), aluminum-copper alloy (AlCu), or other suitable conductive material(s) or layered combination thereof. The top electrode material layer 127 may be deposited by PVD, CVD, ALD, or another suitable deposition process. In some examples, the top electrode material layer 127 has a thickness in a range from about 100 Å to about 600 Å.

The substrate 101 may be a bulk semiconductor substrate or a semiconductor-on-insulator (SOI) substrate, which may be doped (e.g., with a p-type or an n-type dopant) or undoped. Generally, an SOI substrate includes a layer of a semiconductor material formed on an insulator layer. The insulator layer may be a buried oxide (BOX) layer or a silicon oxide layer. The insulator layer may be provided on a silicon or glass substrate. The substrate 101 may be made of silicon or another semiconductor material. For example, the substrate 101 is a silicon wafer. In some examples, the substrate 101 is made of a compound semiconductor such as silicon carbide, gallium arsenic, indium arsenide, or indium phosphide. In some examples, the substrate 101 is made of an alloy semiconductor such as GaAsP, AlInAs, AlGaAs, GaInAs, GaInP, or GaInAsP.

In some embodiments, the substrate 101 includes various p-type doped regions and/or n-type doped regions, such as p-type wells and/or n-type wells, formed by a process such as ion implantation and/or diffusion. The substrate 101 may include functional elements such as resistors, capacitors, diodes, and transistors. The transistors are, for example, field effect transistors (FETs), such as planar FETs and/or Fin field effect transistors (FinFETs). The substrate 101 may include lateral isolation features configured to separate various functional elements formed on and/or in the substrate 101.

In some examples, the IMD layers 105 may be made of silicon dioxide ($SiO_2$), silicon oxynitride (SiON), phosphosilicate glass (PSG), borosilicate glass (BSG), borophosphosilicate glass (BPSG), undoped silicate glass (USG), fluorinated silicate glass (FSG), Spin-On-Glass (SOG), or a combination thereof. The IMD layers 105 may be deposited by spin-on coating, chemical vapor deposition (CVD), flowable CVD (FCVD), plasma enhanced CVD (PECVD), physical vapor deposition (PVD), or another deposition process.

The materials of the metal lines 107 and the conductive vias 109 may include aluminum (Al), copper (Cu), gold (Au), tungsten (W), other suitable metal or metal alloy materials, or a combination thereof. The metal lines 107 and the conductive vias 109 may be formed by a dual damascene process, a single damascene process or a combination thereof. A metal material for the metal lines 107 and the conductive vias 109 may be deposited on the IMD layer 105 and to fill the holes in the IMD layer 105 using atomic layer deposition (ALD), PECVD, PVD, or another deposition process. Next, any excess portions of the metal material over the IMD layer 105 are removed by a planarization process such as a chemical mechanical polishing (CMP) process to form the metal lines 107 and the conductive vias 109 in the IMD layer 105.

Figure 2:
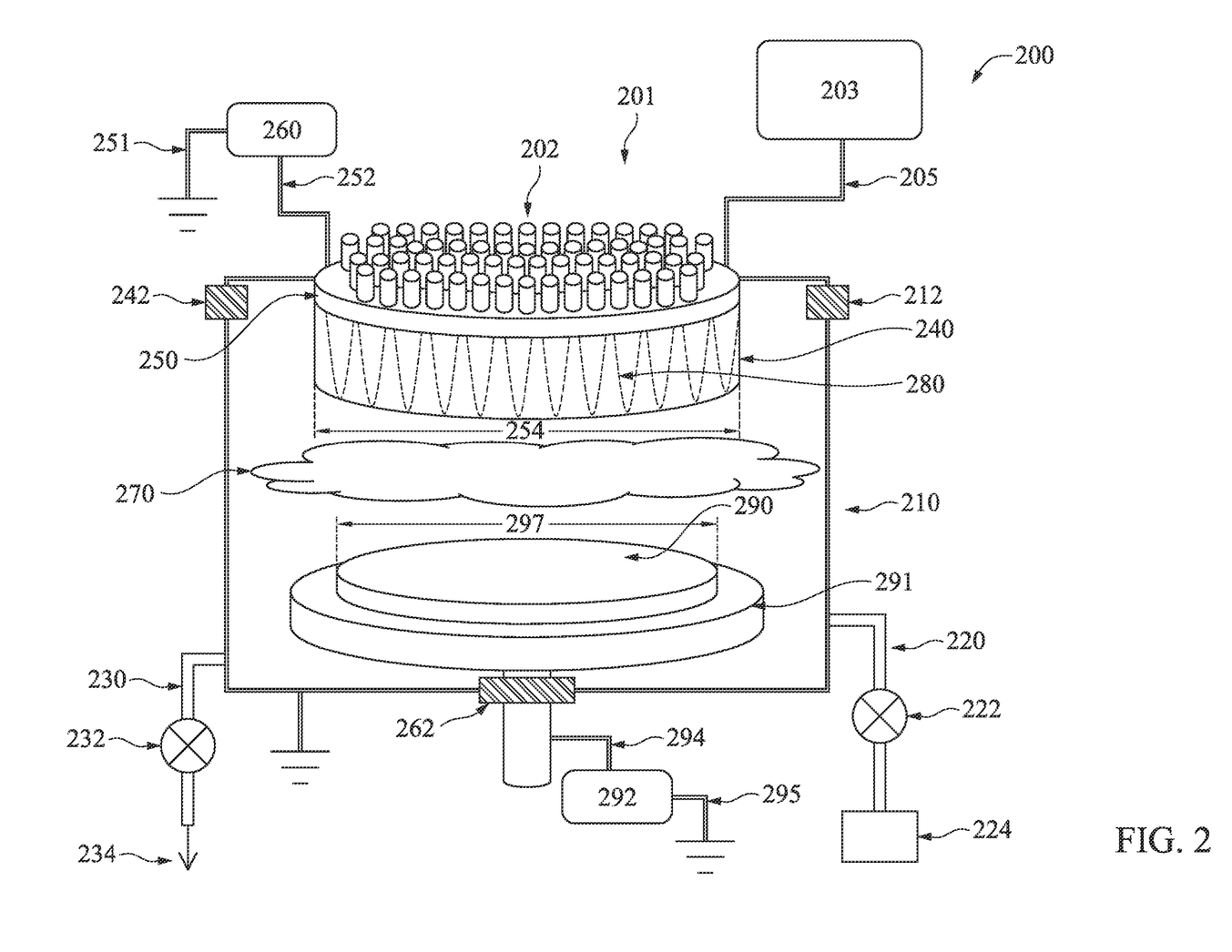
FIG. 2 is a simplified cross-sectional view of a sputtering system, in accordance with some embodiments.

FIG. 2 is a simplified cross-sectional view of a sputtering system, in accordance with some embodiments. FIG. 2 shows a schematic diagram of a sputtering system 200, according to various embodiments. Sputtering system 200 is an example of a sputtering system that can be used in forming various thin films by physical vapor deposition (PVD) in the intermediate device structure 100 in FIG. 1. For example, in the intermediate device structure 100 in FIG. 1 for MRAM, the first ferromagnetic layer 121 and the second ferromagnetic layer 125, which can be configured to be a pinned layer and a free layer, respectively, may be made of CoFeB, CoFeTa, NiFe, Co, CoFe, CoPt, CoPd, FePt, Ru, or other alloys of Ni, Co and Fe. The pinned layer may be deposited using various deposition processes including PVD. Moreover, other thin films in intermediate device structure 100 in FIG. 1 can also be formed by PVD, such as insulating barrier layer 123, top electrode material layer 127, metal lines 107, conductive vias 109, and bottom electrodes 117BE.

As shown in FIG. 2, the sputtering system 200 includes a vacuum sputtering chamber 210. The vacuum chamber 210 is in fluid communication with a vacuum source 234 via a passage 230. The vacuum source 234 can include one or more vacuum pumps. The passage 230 further includes a valve 232, which is operable to shut off the fluid communication between the vacuum chamber 210 and the vacuum source 234. The vacuum chamber 210 is also in fluid communication with a gas source 224 via a passage 220. The gas source 224 is a source of gas used to generate a plasma within the vacuum chamber 210. In some embodiments, the gas is an inert gas, such as argon. In some other embodiments, the gas can be oxygen or nitrogen. In some instances, there are more than one gas source and at least one of the gas sources is a source of an inert gas, such as argon. The passage 220 to the gas source 224 is controlled by a valve 222, which is operable to modulate gas flow or completely shut off the fluid communication between the vacuum chamber 210 and the gas source 224. The sputtering system 200 further includes a pedestal 291 for holding a substrate 290. The substrate 290 can be a wafer, part of a wafer, or a substrate with fabricated features thereon.

The sputtering system 200 is configured to receive a target 240 (also referred to as a sputtering target 240) within the vacuum chamber 210. The target 240 can be formed of a metal, a conductive metallic compound, an alloy, or a metal solid solution. In some embodiments, the target 240 can be mounted on a back plate 250. Non-exhaustive examples of materials for the target 240 and back plate 250 include aluminum (Al), copper (Cu), gold (Au), nickel (Ni), cobalt (Co), manganese (Mn), titanium (Ti), tantalum (Ta), graphite (C), tungsten (W), ruthenium (Ru), molybdenum (Mo), niobium (Nb), palladium (Pd), indium (In), gallium (Ga), boron (B), antimony (Sb), vanadium (V), tin (Sn), ytterbium (Yb), yttrium (Y), zirconium (Zr), chromium (Cr) and alloys and solid solutions thereof. The back plate 250 and the target 240 can be formed of the same material or different materials. In some implementations, the back plate 250 is formed of materials with properties that compensate for the material properties of the target 240. For example, in cases where the material of the target 240 has low thermal conductivity, the material of the back plate 250 can be those with high thermal conductivity. Besides thermal conductivity, material properties to be considered can include electrical and magnetic conductivities.

As shown in FIG. 2, the substrate 290 is mounted on the pedestal 291, which is electrically coupled to a power supply 292 via a transmission line 294, and the target 240 is coupled to a power supply 260 via the back plate 250 and a transmission line 252. That way, an electric field can be applied across the target 240 and the pedestal 291. Both the pedestal 291 and the back plate 250 are made of conductive materials. In some embodiments, the power supply 292 is a radio frequency (RF) power supply having the transmission line 294 connecting to the pedestal 291 and a grounding line 295 connected to the ground. The conductive pedestal 291 that is connected to the power supply 292 is insulated from the vacuum chamber 210 by an insulation member 262. In some instances, the power supply 260 is a direct current (DC) power supply having the transmission line 252 connecting to the back plate 250 and a grounding line 251 connected to the ground. In some embodiments represented by FIG. 2, the back plate 250 and/or the structure that supports it is insulated from the vacuum chamber 210 by insulation members 212 and 242. The vacuum chamber 210 is therefore insulated by the insulation members 212, 242, and 262 from the power supply 292 and the power supply 260. The vacuum chamber can be grounded, as shown in FIG. 2.

In operation, the back plate 250 and the target 240 serve as a cathode and the pedestal 291 serves as an anode. The power supplies 260 and 292 can apply a static or a dynamically changing voltage across the cathode and the anode and thereby cause an electric field to be developed between the cathode and anode. The strength of the electric field, which is generated by the power supply 260, the power supply 292, or the combination of the two, is selected such that the gas from the gas source 224 can be ionized and ignited into a plasma 270. In instances where argon (Ar) is fed from the gas source 224, Ar atoms will give up an electron and exist in the plasma 270 as positively charged argon ions (Ar+). As illustrated in FIG. 2, the positively charged argon ion in the plasma 270 will be accelerated by the electric field and bombard the surface of the target 240. If the positively charged argon ion carries sufficient energy, it can dislodge atoms of the target, which are then deposited on the substrate 290.

In some embodiments, the sputtering system 200 further includes an electromagnet module 201 over the target 240. The electromagnet module 201 comprises an electromagnet array of a plurality of electromagnets 202. In this regard, the electromagnet module 201 can be referred to as the electromagnet array 201 from time to time. The electromagnet array 201 can be used to generate a magnetic field 280 near the target 240. The magnetic field 280 can be designed to trap electrons near the target, thereby increasing the density of the plasma 270, increasing ionization rate, and facilitating the sputtering process. In some embodiments, the electromagnet module 201 is connected to a controller 203 via a transmission line 205. The controller 203 can control the magnitude and polarity of the magnetic flux of each of the electromagnets 202 in the electromagnet module 201. That is, the magnetic field that is generated near the target 240 can be customized by changing the parameters or programs of the controller 203 for different geometries of the vacuum chamber 210, different materials of the target 240, different thicknesses of the target 240, different plasma gas species, and different electric field strengths. In some embodiments, for a given vacuum chamber 210 and a given type of target 240, experiments can be conducted to determine a default setting (or default pattern, default magnetization pattern) for the electromagnet array 201. The default setting is determined based on uniformity of deposition rate on the substrate 290 and the uniformity of the consumption rate of the target 240 for a given set of target material and process parameters. Each of the given set of target material and process parameters can be referred to as a standard setting. In some embodiments, each standard setting can correspond to a unique default pattern of the electromagnet array 201 to achieve a uniform deposition rate and uniform target consumption. In some other embodiments, the default pattern of the electromagnet array 201 can be determined based on a standard setting that includes a target material with mid-range target properties and mid-range process parameters. In those embodiments, the default pattern is a general one for all target materials and process parameters. In some implementations, unless the controller 203 is commanded to use a specific pattern, the default pattern is loaded at the initiation of a sputtering process using the sputtering system 200.

Figure 3A:
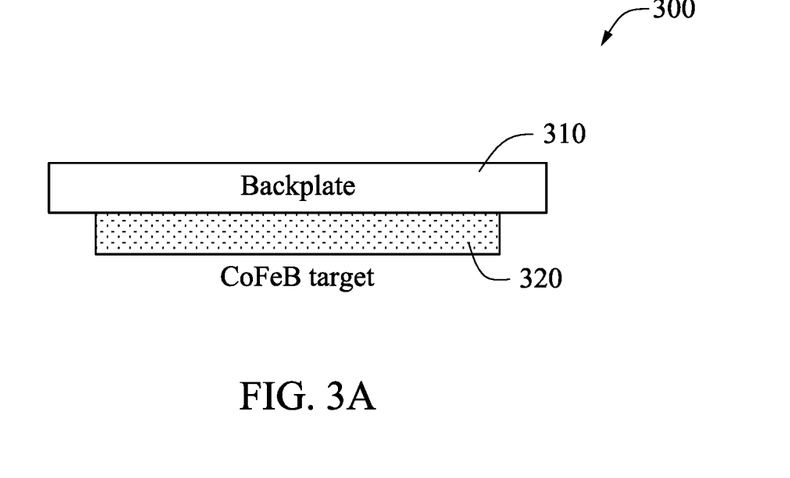
FIGS. 3A and B are simplified top and cross-sectional views, respectively, of a sputtering target structure, in accordance with some embodiments.
Figure 3B:
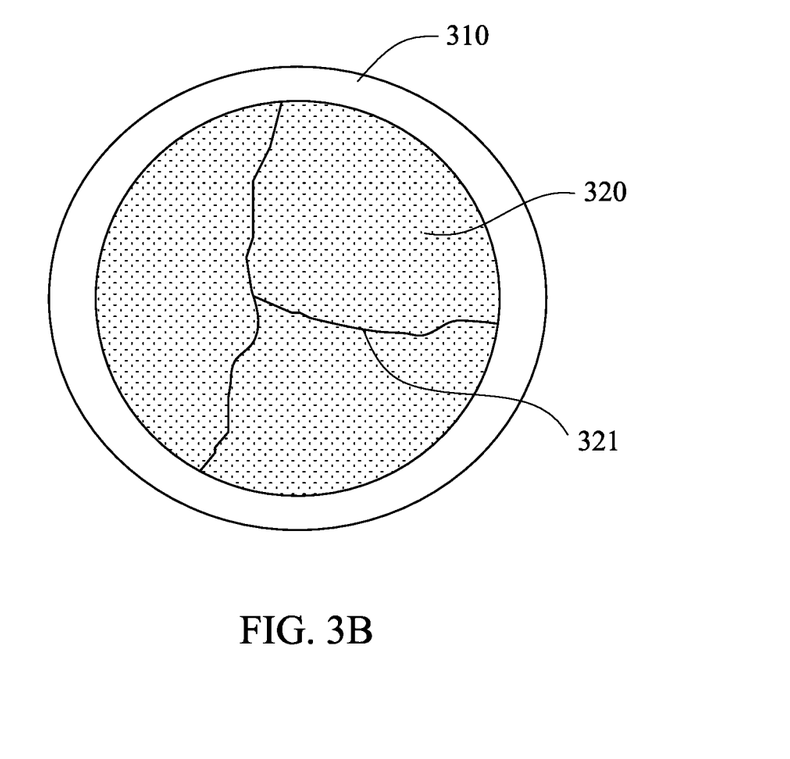

FIGS. 3A and 3B are simplified top and cross-sectional views, respectively, of a sputtering target structure, in accordance with some embodiments. Sputtering target structure 300 shown in FIGS. 3A and 3B is an example of sputtering target 240 in sputtering system 200 of FIG. 2. As shown in FIGS. 3A and 3B, a sputtering target structure 300 includes a back plate 310 and a sputtering target 320 bonded to the back plate 310. In this example, sputtering target 320 is a target for forming an MRAM (Magnetoresistive Random Access Memory) device. As described above in connection to FIG. 1, the first ferromagnetic layer 121 or the second ferromagnetic layer 125 is made by PVD using a sputtering target of a ferromagnetic material, for example, CoFeB, CoFeTa, NiFe, Co, CoFe, CoPt, CoPd, FePt, Ru, or other alloys of Ni, Co, and Fe. In this case, the inventor has observed, as shown in FIG. 3B, cracks 321 forming in the sputtering target 320 for ferromagnetic materials such as CoFeB or FeB after a sputtering operation. The inventor has observed that CoFeB or FeB alloys are brittle and cracking, especially with high boron content. For example, the sputtering targets containing a boron (B) content of greater than 15%, or 20%, or more, are susceptible to crack formation.

Figure 4:
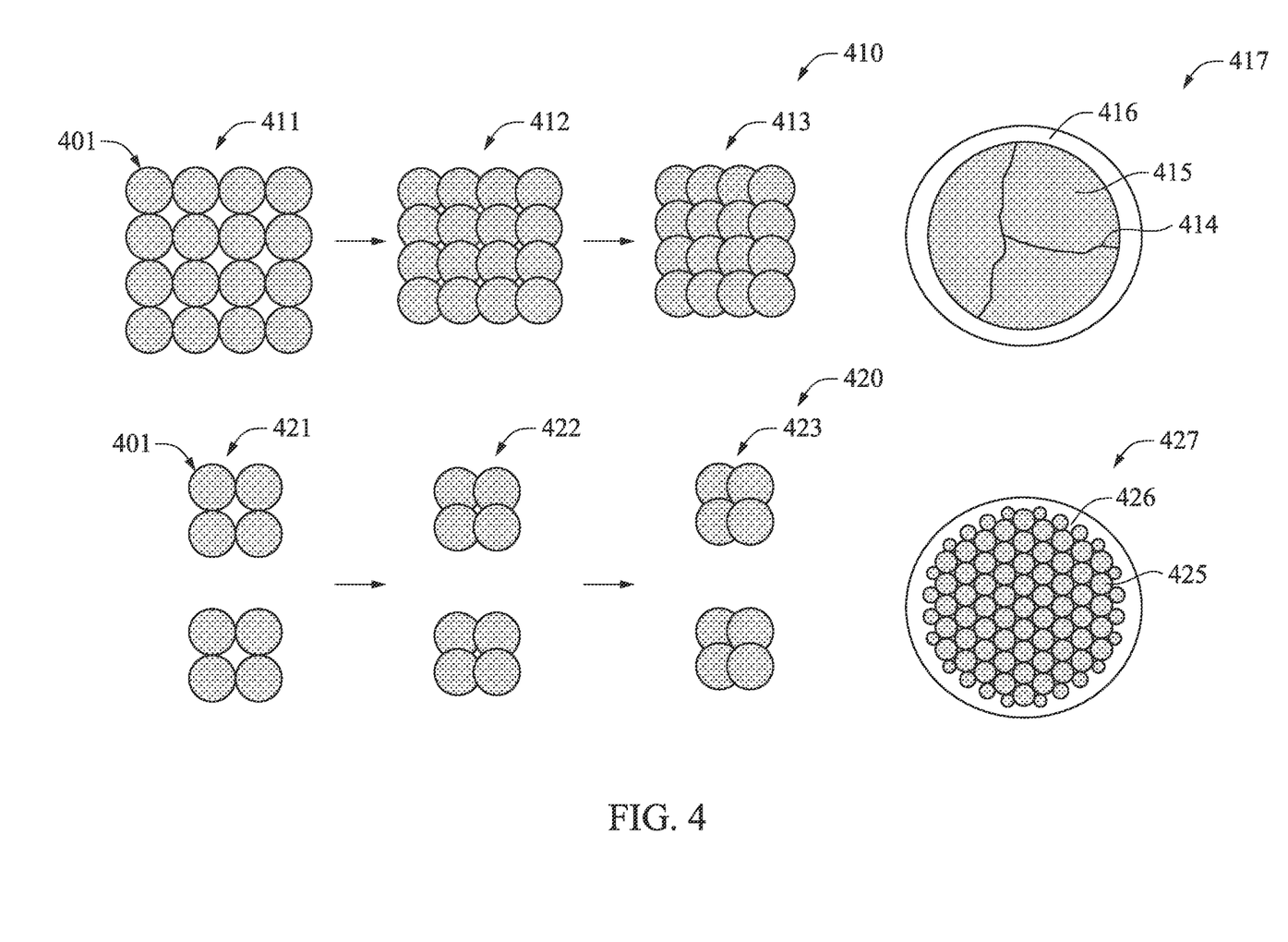
FIG. 4 are simplified diagrams illustrating two processes for forming sputtering target structures, in accordance with some embodiments.

FIG. 4 are simplified diagrams illustrating two processes for forming sputtering target structures, in accordance with some embodiments. In FIG. 4, two processes 410 and 420 are shown for forming sputtering target structures for CoFeB or FeB target for MRAM (Magnetoresistive Random Access Memory) wafers. In process 410, powders 401 of target materials Co, Fe, and B are gathered (at 411) in a container such as a mold (not shown), pressed (at 412), and sintered (at 413) to form a single contiguous sputtering target 415 on a back plate 416. Sputtering target 415 on back plate 416 is referred to as a sputtering target structure 417, which is an example of the sputtering target structure 300 in FIG. 3 or sputtering target 250 in FIG. 2.

In process 420, according to some embodiments, powders 401 of Co, Fe, and B are gathered (at 421) in multiple molds (not shown) for sub-targets, pressed (at 422), and sintered at 423) to form a plurality of sub-targets 425, which are bonded on a back plate 426. Sub-targets 425 bonded on back plate 426 are referred to as a second sputtering target structure 427, which is another example of the sputtering target structure 300 in FIG. 3 or sputtering target 250 in FIG. 2. The inventor has observed that smaller sub-targets of sizes below a certain size, referred to as a threshold target size, do not exhibit crack formation in a sputtering operation. In FIG. 4, the sizes of the sub-targets 425 in sputtering target structure 427 are chosen to be below the threshold target size below which the sub-targets exhibit no cracks. A method is described below with reference to FIGS. 5-8 for forming sputtering target structures that are not susceptible to crack formation.

Figure 5:
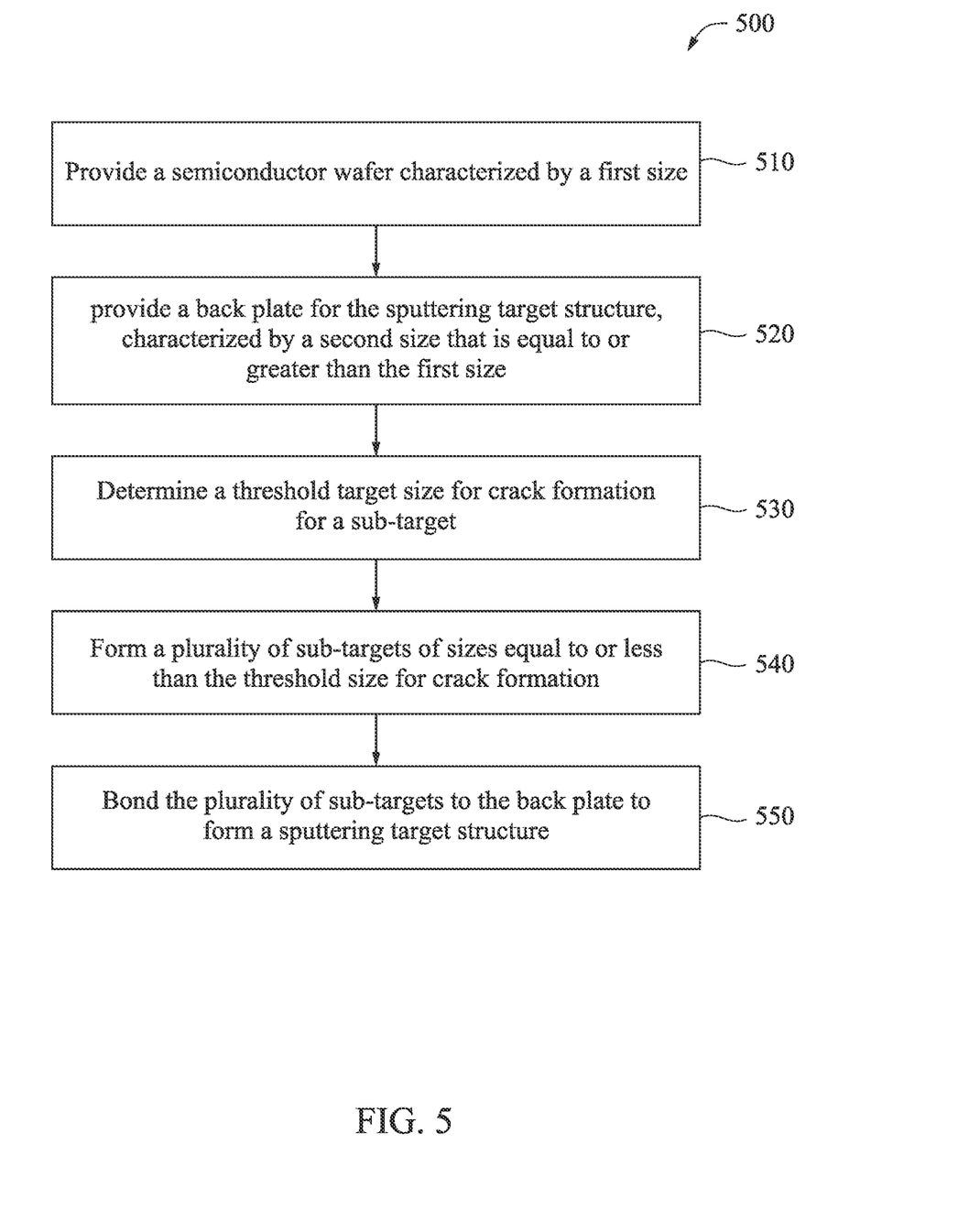
FIG. 5 is a simplified flowchart illustrating a method for forming a sputtering target structure, in accordance with some embodiments.

FIG. 5 is a simplified flowchart illustrating a method for forming a sputtering target structure, in accordance with some embodiments. As shown in FIG. 5, the method 500 for forming a sputtering target structure can be summarized briefly here and explained further below.

Process 510—Provide a semiconductor wafer configured to receive a film of a first material through sputtering, the semiconductor wafer characterized by a first size;

Process 520—Provide a back plate for the sputtering target structure, the back plate characterized by a second size that is equal to or greater than the first size;

Process 530—Determine a threshold target size for a sub-target, the threshold target size being a fraction of the second size, below which no cracks are formed in the sub-target sputtering operation;

Process 540—Form a plurality of sub-targets comprising sub-targets characterized by sizes equal to or less than the threshold target size; and Process 550—Bond the plurality of sub-targets to the back plate to form a sputtering target structure.

At 510, the method incudes providing a semiconductor wafer configured to receive a film of a first material through sputtering, the semiconductor wafer characterized by a first size. Depending on the embodiments, the first size of the semiconductor wafer can vary from 1 inch (25 mm) to 27 inches (675 mm), or larger. In some embodiments, the first size of the semiconductor wafer ranges from 4 inches (100 mm) to 27 inches (675 mm).

At 520, the method includes providing a back plate for the sputtering target structure, the back plate characterized by a second size that is equal to or greater than the first size. For example, the second size of the back plate, can be in a range of 2 inches (50 mm) to 48 inches (1,200 mm).

At 530, the method includes determining a threshold target size for a sub-target, the threshold target size being a fraction of the second size, below which no cracks are formed in the sub-target sputtering operation. Here, the method includes forming multiple trial target structures. Each trial target structure includes a plurality of sub-targets disposed on a back plate of the second size. In some embodiments, all sub-targets in a given trial target structure are characterized by a same respective sub-target size. The sizes of the sub-targets for the multiple trial target structures range from 5% to 75% of the second size. For example, a first trial target structure has sub-targets that are characterized by 5% of the second size, a second trial target structure has sub-targets that are characterized by 10% of the second size, a third trial target structure has sub-targets that are characterized by 15% of the second size, and so on.

In alternative embodiments, determining the threshold target includes forming one or more trial target structures. Each trial target structure includes a plurality of sub-targets disposed on the back plate. Each of the plurality of sub-targets in a given trial target structure is characterized by a respective sub-target size ranging from 5% to 75% of the size of the back plate.

Next, sputtering operations are performed to determine crack characteristic for each of the multiple trial target structures. After the sputtering operation, the trial target structure is inspected for cracks. In some cases, the sputtering system may provide warnings of chamber contamination, indicating possible crack formation in the sputtering target. In other cases, the wafers may exhibit high particle counts after sputtering. The trial target structures are inspected after the sputtering operations to identify crack formation in the trial target structures. The crack information can include the number of the cracks, the length of the cracks, the width of the cracks, etc. The crack formation is then correlated to sizes of the sub-targets. For example, for a sputtering target with a diameter of 8 inches (300 mm), 10 groups of sub-targets are made with diameters spanning a range of 0.2 inches (5 mm) to 8 inches (300 mm). Next, 10 trial target are made using sub-targets of diameters of different sizes. 10 trial targets are made using the sub-targets of different sizes. The trial targets are used in sputtering operations. After the sputtering operations, the trial targets are examined to determine the number of cracks associated with each sub-target sizes. Subsequently, a threshold target size of the sub-targets is identified. In one example, it is determined that trial targets made with sub-targets with diameters less than 2 inches (50 mm) exhibits no cracks. In this example, the threshold target size for crack formation is determined to be 2 inches (50 mm). In another example, the threshold target size for crack formation is determined to be 4 inches (100 mm). In other words, the trial sputtering targets made of sub-targets below the threshold target size exhibits no cracks after the sputtering operation.

In the alternative embodiments described above, each of the plurality of sub-targets in a given trial target structure is characterized by a respective sub-target size ranging from 5% to 75% of the size of the back plate. In these embodiments, trial sputtering operations are performed to determine crack characteristics for each size of the plurality of sub-targets. Next, a threshold target size of the sub-targets is determined, below which no cracks are formed in the sputtering operation.

At 540, the method includes forming a plurality of sub-targets comprising sub-target characterized by sizes equal to or less than the threshold target size. In some embodiments, the method includes pressing powders of a ferromagnetic material including one or more of cobalt iron-boron (CoFeB) or iron-boron (FeB) to form the sub-target, and sintering the sub-target at a selected temperature.

At 550, sputtering target structures are made by bonding the plurality of sub-targets to the back plate. Various bonding method can be used, for example, diffusion bonding, solder bonding, etc. Diffusion bonding or diffusion welding is a solid-state welding technique used in metalwork for joining similar and dissimilar metals. It is based on the principle of solid-state diffusion, wherein the atoms of two solid, metallic surfaces intersperse themselves over time. This is typically accomplished at an elevated temperature, and usually implemented by applying high pressure.

Figure 6:
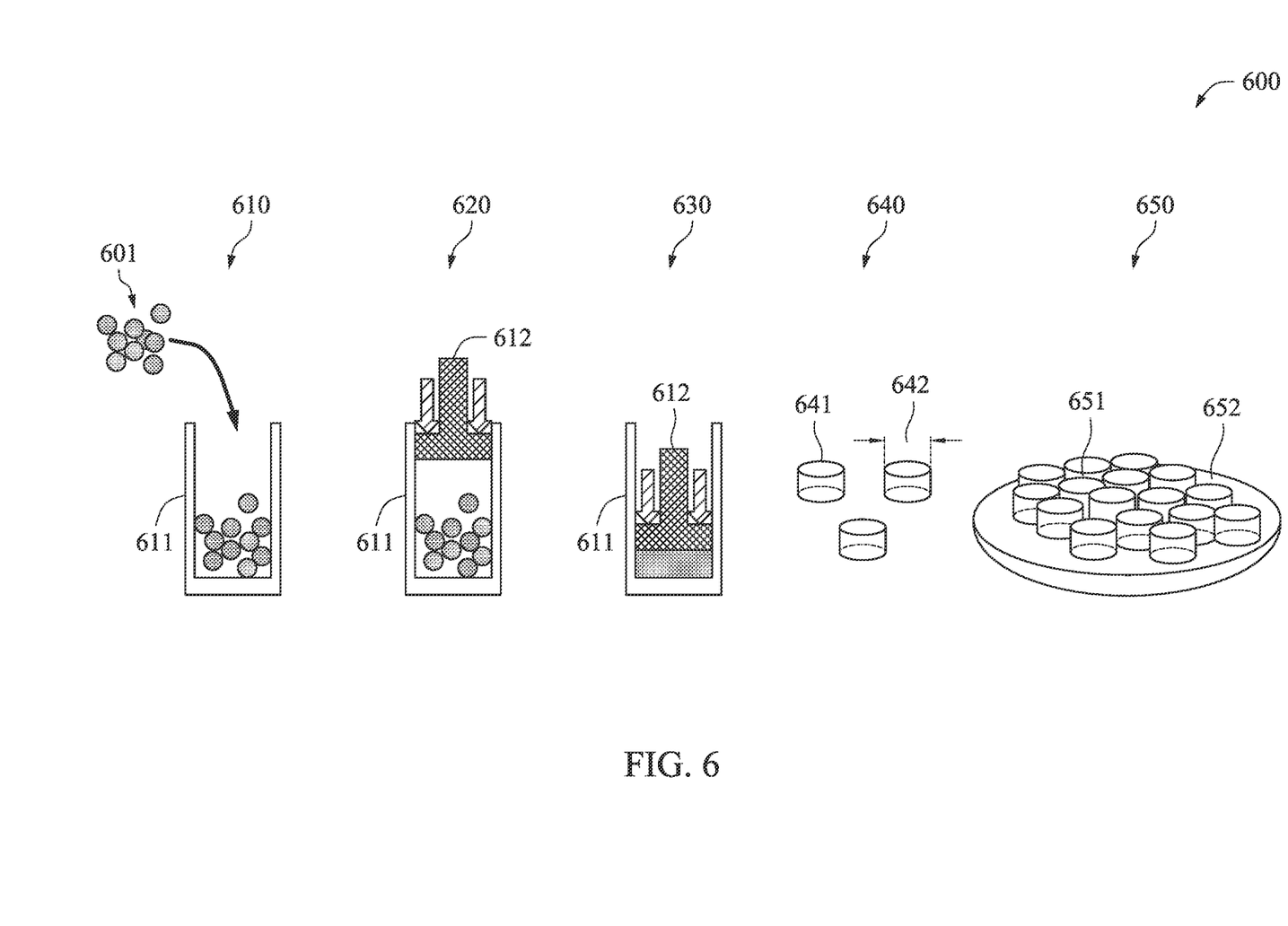
FIG. 6 shows simplified diagrams illustrating a process for forming sub-targets for forming sputtering target structures, in accordance with some embodiments.

FIG. 6 shows simplified diagrams illustrating a process for forming sub-targets, in accordance with some embodiments. In FIG. 6, diagrams 610-630 show a suitable hot press apparatus, including a mold 611 and a ram 612, with heating means not shown. At 610, powders 601 of the material intended to form the sputtering target are disposed in mold 611. For example, in some embodiments, powders 601 can include CoFeB, FeB, etc. In this example, a mixture of Co, Fe, and B powders in proportions to produce the desired CoFeB composition is loaded into mold 611. At 620, the apparatus is placed in a vacuum hot press (not shown), heated to between about 1300° C. to 1500° C., and pressed at 20 to 35 MPa of pressure (e.g., 3000 to 5000 psi) to, as shown at 630. Next, sintering is performed to convert the powders into a solid preform. At 640, the resulting hot pressed and sintered sub-target 641 may then be cooled, and removed from the mold 611. The sub-targets are characterized by a size 642 that is equal to or less than the threshold target size. At 650, the individual sub-targets 651 are bonded to a back plate 652, by any suitable bonding method.

As shown in FIG. 6, at 650, the individual sub-targets 651 are bonded to a back plate 652, e.g., aluminum, by any suitable method. Various bonding methods can be used, for example, diffusion bonding, solder bonding, etc.

Although a particular example has been described with respect to a cobalt-iron-boron (CoFEB) target, the techniques described herein are applicable to other target materials, such as tungsten alloys, e.g., tungsten-silicon alloys, titanium and titanium alloys, titanium-aluminum alloys, and cobalt and cobalt alloys such as cobalt-silicon alloys. The backing plate may comprise aluminum, aluminum alloys, titanium, or titanium alloys.

In some embodiments, each of the plurality of sub-targets is in direct contact with one or more adjacent sub-targets. In some embodiments, the target structure comprises gaps on the back plate, each gap enclosed by two or more sub-targets. In some embodiments, each of the sub-targets is characterized by a circular shape of a selected diameter below the threshold target size for crack formation. In some embodiments, each of the plurality of sub-targets is in direct contact with one or more adjacent sub-targets without an adhesive material between adjacent sub-targets, three adjacent sub-targets enclosing a gap region. In some embodiments, the sputtering target structure further comprises a second plurality of sub-targets characterized by a diameter smaller than the selected diameter and disposed at an outer periphery of the back plate.

Figure 7A:
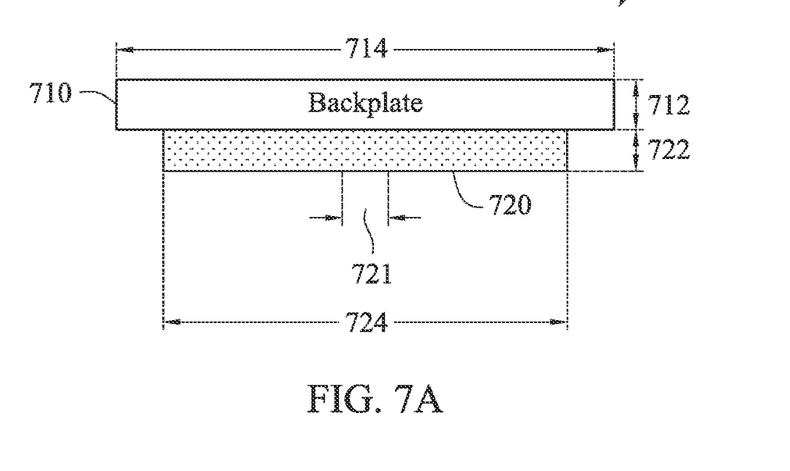
FIGS. 7A and 7B are simplified top and cross-sectional views, respectively, of a sputtering target structure that are not susceptible to crack formation, in accordance with some embodiments.
Figure 7B:
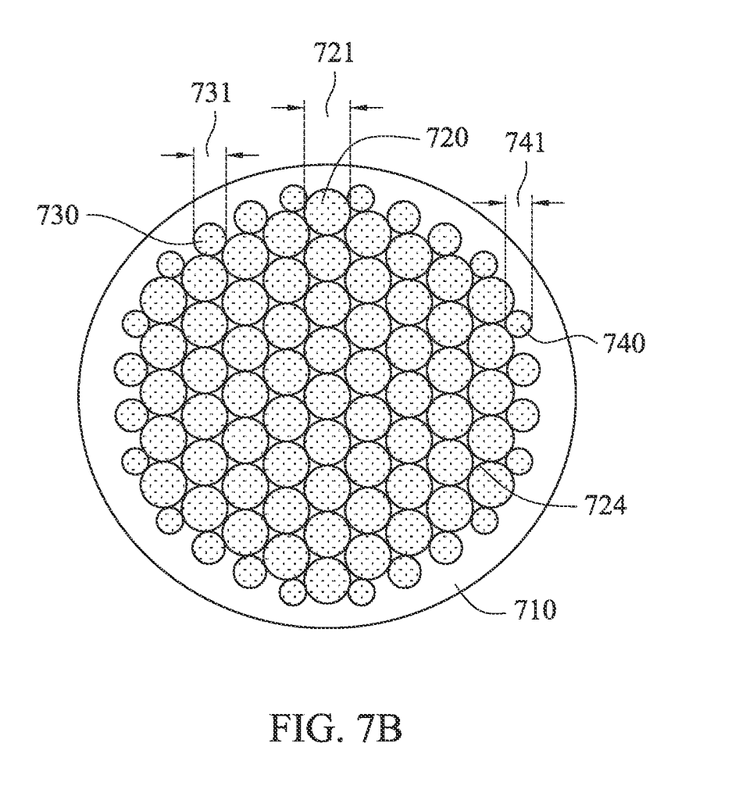

FIGS. 7A and 7B are simplified top and cross-sectional views, respectively, of a sputtering target structure for avoiding crack formation, in accordance with some embodiments. As shown in FIGS. 7A and 7B, a sputtering target structure 700 includes a back plate 710 and a plurality of sub-targets 720 bonded to the back plate 710. Each of the plurality of sub-targets 720 is characterized by a size 721 that is equal to or less than a threshold target size D for crack formation. As described above in connection with FIG. 5, the sub-targets with sizes equal to or less than the threshold target size D exhibit crack formation after sputtering operations. In some embodiments, the sputtering target structure further includes a second plurality of sub-targets 730, characterized by a second size 731 smaller than the size 721 and disposed at an outer periphery of the back plate. In some embodiments, the sputtering target structure further includes a third plurality of sub-targets 740, characterized by a third size 741 smaller than the size 731 and disposed at an outer periphery of the back plate.

In some embodiments, such as the example in FIGS. 7A and 7B, each of the plurality of sub-targets includes a ferromagnetic material containing iron (Fe) and boron (B).

In some embodiments, each of the plurality of sub-targets is in direct contact with one or more adjacent sub-targets without an adhesive material between adjacent sub-targets, three adjacent sub-targets enclosing a gap region.

In some embodiments, the back plate can be made of a metal, such as aluminum, a ceramic material, such as aluminum oxide, or other substrates. The size or diameter of the sub-targets is selected to avoid cracking that occurs in larger targets, for example, less than the size of the sputtering target or back plate. The size or diameter of the sub-targets is chosen such that the sub-targets do not exhibit cracking. For example, the size of the sub-target can be less than 1 inch, or 0.5 inches, or less than 0.1 inches, etc. Alternatively, the size of the sub-target can be as large as, e.g., half of the size of the back plate.

In some embodiments, the thickness of the back plate 712 is in the range of 0.1 to 1 inch. In some embodiments, the thickness of the back plate 712 is approximately 0.25 inches. In some embodiments, the thickness of the sub-targets 722 is in the range of 0.1 to 1 inch. In some embodiments, the thickness of the sub-targets 722 is approximately 0.25 inches. It is understood, however, the dimensions mentioned above are merely given as examples, and other suitable dimensions can also be used.

Figure 8:
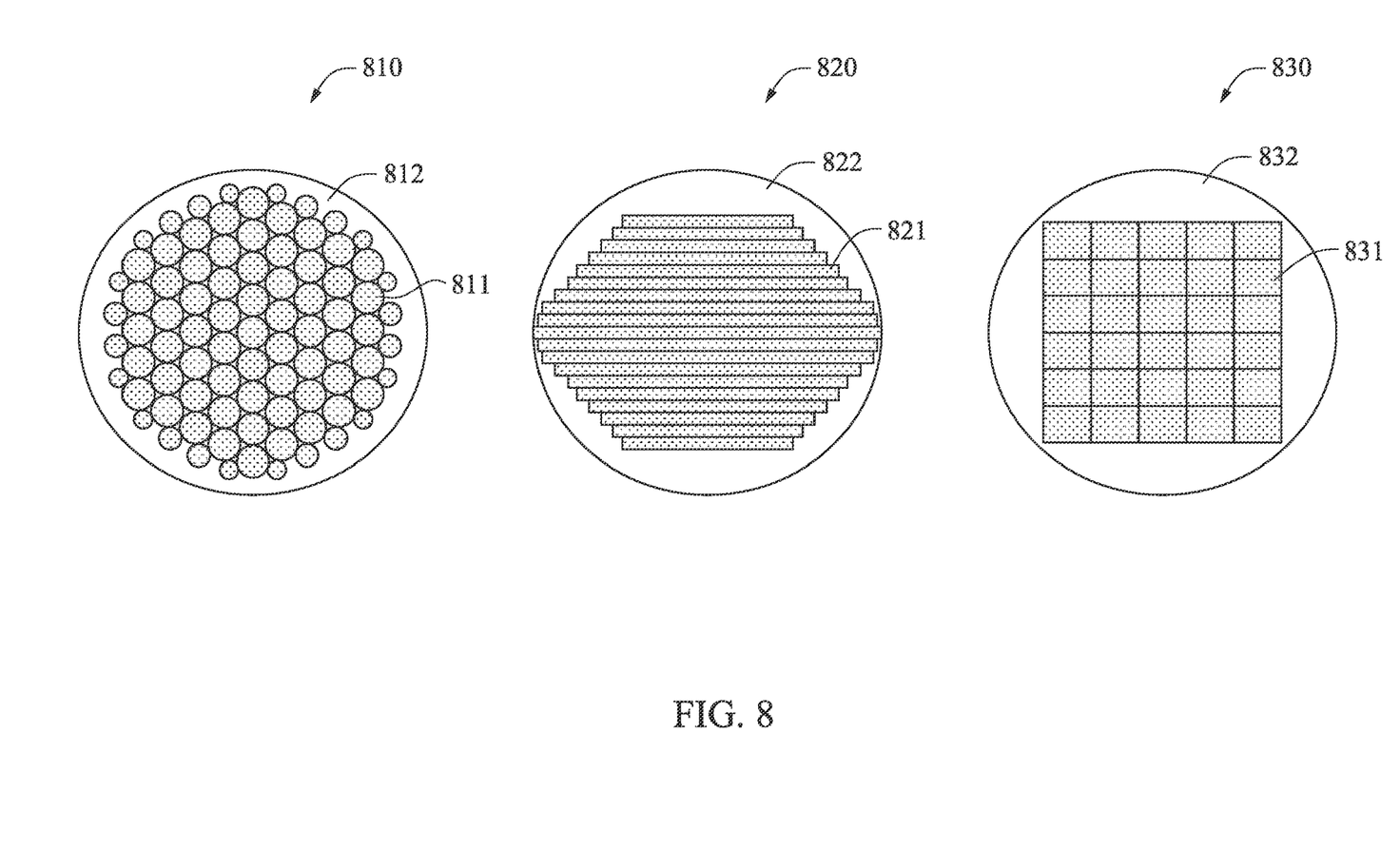
FIG. 8 are simplified top views of various sputtering target structures, in accordance with some embodiments.

FIG. 8 illustrates simplified top views of various sputtering target structures, in accordance with some embodiments. In various embodiments, the sub-targets can take on various shapes, such as circular, elliptical, cylindrical, square, rectangular, hexagonal, etc. In some cases, there are no gaps between adjacent sub-targets bonded on the back plate. In other cases, there can be gaps between adjacent sub-targets bonded on the back plate. FIG. 8 illustrates a top view of a first sputtering target structure 810 that includes a plurality of sub-targets 811 bonded on a back plate 812, similar to sputtering target structure 700 in FIG. 7. FIG. 8 also illustrates a top view of a second sputtering target structure 820 that includes a plurality of sub-targets 821 bonded on a back plate 822. The second sputtering target structure 820 includes rectangular sub-targets 821 of various lengths. In this embodiment, the widths of the sub-targets 821 are equal to or less than a threshold target width determined for sub-targets 821. FIG. 8 also illustrates a top view of a third sputtering target structure that includes a plurality of square sub-targets 831 bonded on a back plate 832. In this embodiment, the size of the sub-targets 831 are equal to or less than a threshold target width determined for sub-targets 831. In sputtering target structures 820 and 830, there are no gaps between adjacent sub-targets bonded on the back plate.

In some embodiments, each sub-target includes CoFeB. In other embodiments, each sub-target can include other materials, which may be susceptible to cracking when made into a target.

In some embodiments, a method for forming a sputtering target includes forming a plurality of sub-target, and bonding the plurality of sub-targets to a back plate to form the sputtering target.

In some embodiments, forming the plurality of sub-targets includes, for each of the plurality of sub-targets: pressing powders of a metallic alloy to form the sub-target and sintering the sub-target. In other embodiments, forming the plurality of sub-targets includes forming each of the plurality of sub-targets by casting.

Specific examples are described using CoFeB/FeB targets, that are often used in MRAM products or other semiconductor devices. However, the method and structures described herein are applicable to any sputtering targets that are susceptible to cracking, some of which are listed above.

In some embodiments, a method for sputtering ferromagnetic films on a semiconductor wafer is provided. With reference to FIGS. 1, 2, 4-6, 7A, and 7B, the method includes disposing a semiconductor wafer for a magnetoresistive random-access memory (MRAM) device in a sputtering chamber, the semiconductor wafer having an interconnect structure formed thereon, a bottom electrode layer formed on the interconnection structure, a first ferromagnetic layer arranged over the bottom electrode layer, an insulating barrier layer arranged over the first ferromagnetic layer. The wafer is characterized by a first diameter in a range of 3 inches (75 mm) to 27 inches (675 mm). The method also includes disposing a sputtering target structure in the deposition chamber, wherein the sputtering target structure is characterized by a second diameter that is equal to or greater than the first diameter, the sputtering target structure including a plurality of sub-targets bonded to a back plate, each of the plurality of sub-targets comprising a ferromagnetic material containing iron (Fe) and boron (B). Each of the sub-targets is characterized by a circular shape of a third diameter that is a fraction of the second diameter, the third diameter being equal to or less than a threshold target size for crack formation. Further, each of the plurality of sub-targets is in direct contact with one or more adjacent sub-targets without an adhesive material between adjacent sub-targets, three adjacent sub-targets enclosing a gap region. The method also includes performing sputtering using the sputtering target structure to form a ferromagnetic layer on the insulating barrier layer on the wafer to form a first ferromagnetic layer, forming an insulating barrier layer arranged over the first ferromagnetic layer, performing sputtering using the sputtering target structure to form a ferromagnetic layer on the insulating barrier layer on the wafer to form a second ferromagnetic layer, and forming a top electrode layer on the second ferromagnetic layer to form a magnetic tunnel junction (MTJ) structure for a magnetoresistive random-access memory (MRAM) device.

In some embodiments of the above method, each of the ferromagnetic materials includes one or more of cobalt-iron-boron (CoFeB) or iron-boron (FeB).

In some embodiments, the sputtering target structure further comprises a second plurality of sub-targets characterized by a third diameter smaller than the second diameter and disposed at an outer periphery of the plurality of sub-targets.

In some embodiments, forming a sub-target includes pressing powders of the ferromagnetic material including one or more of cobalt-iron-boron (CoFeB) or iron-boron (FeB) to form the sub-target, and sintering the sub-target at a selected temperature.

Depending on the application and sputtering operations, the threshold target size can vary. In some embodiments, the threshold target size is 1 inch (25 mm). In some embodiments, the threshold target size is 2 inches (50 mm). In some embodiments, the threshold target size is 4 inches (100 mm).

The core magnetic films forming magnetic tunnel junctions in MRAM and STTRAM often are made of cobalt-iron-boron (CoFeB) or iron-boron (CoFeB) alloys with high boron content, or other suitable materials. However, CoFeB or FeB alloys are brittle. Traditional sputtering targets are often made into one single piece of material with a single top surface, and are susceptible to cracking under stress, especially with high boron content CoFeB or FeB alloys. For example, the sputtering targets exhibiting a boron (B) content of greater than 15%, or 20%, or more are especially susceptible to crack formation. Such cracking in the sputtering targets can result in undesirable particle generation during the sputtering process, causing contamination and defects, and can lead to yield and reliability issues.

Some embodiments provide a method for determining a threshold target size such that sputtering targets characterized by sizes equal to or less than the threshold target size are exhibit not crack formation after sputtering operations. Some embodiments provide sputter target structures having a plurality of sub-targets bonded to a base plate, with the sub-targets characterized by sizes equal to or less than the threshold target size. Such sputtering target structures can reduce or eliminate target crack formation, and avoid particle contamination and related yield and reliability issues.

In some embodiments, a method for sputtering ferromagnetic films on a semiconductor wafer is provided. The method includes disposing a semiconductor wafer in a sputtering chamber. The semiconductor wafer includes a substrate with an interconnect structure disposed thereon and a bottom electrode layer disposed on the interconnection structure. The semiconductor wafer is characterized by a first diameter. The method also includes disposing a sputtering target structure in the sputtering chamber, wherein the sputtering target structure is characterized by a second diameter that is equal to or greater than the first diameter. The sputtering target structure includes a plurality of sub-targets bonded to a back plate, and each of the plurality of sub-targets includes a ferromagnetic material containing iron (Fe) and boron (B). Each of the sub-targets is characterized by a circular shape of a third diameter that is a fraction of the second diameter, and the third diameter is equal to or less than a threshold target size for crack formation. Each of the plurality of sub-targets is in direct contact with one or more adjacent sub targets without an adhesive material between adjacent sub-targets, and three adjacent sub-targets enclose a gap region. The method also includes performing sputtering using the sputtering target structure to form a first ferromagnetic layer on the bottom electrode layer, forming an insulating barrier layer over the first ferromagnetic layer, performing sputtering using the sputtering target structure to form a second ferromagnetic layer on the insulating barrier layer, and forming a top electrode layer on the second ferromagnetic layer to form a magnetic tunnel junction structure for a magnetoresistive random-access memory (MRAM) device.

In some embodiments, a method for forming a sputtering target structure includes providing a semiconductor wafer configured to receive a film of a first material through sputtering, the semiconductor wafer characterized by a first size, and providing a back plate, the back plate characterized by a second size that is equal to or greater than the first size. The method also includes determining a threshold target size for the sub-targets. The threshold target size is a fraction of the second size. A given sub-target characterized by a size equal to or less than the threshold target size exhibits no crack formation in a sputtering operation. The method also includes forming a plurality of sub-targets includes sub-targets characterized by sizes equal to or less than the threshold target size, and bonding the plurality of sub-targets to the back plate to form a sputtering target structure.

In some embodiments, a sputtering target structure includes a back plate characterized by a first size and a plurality of sub-targets bonded to the back plate. Each of the sub-targets characterized by a size that is a fraction of the first size and is equal to or less than a threshold target size. A given sub-target characterized by a size equal to or less than the threshold target size exhibits no crack formation in a sputtering operation. Each sub-target includes a ferromagnetic material containing iron (Fe) and boron (B). Each of the plurality of sub-targets is in direct contact with one or more adjacent sub targets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a sputtering target structure, comprising:
    providing a semiconductor wafer configured to receive a film of a first material through sputtering, the semiconductor wafer characterized by a first size;
    providing a back plate, the back plate characterized by a second size that is equal to or greater than the first size;
    determining a threshold target size for the sub-targets, the threshold target size being a fraction of the second size, wherein a given sub-target characterized by a size equal to or less than the threshold target size exhibits no crack formation in a sputtering operation;
    forming a plurality of sub-targets comprising sub-targets characterized by sizes equal to or less than the threshold target size; and
    bonding the plurality of sub-targets to the back plate to form a sputtering target structure.

2. The method of claim 1, wherein determining the threshold target size comprises:
    forming multiple trial target structures, each trial target structure comprising a plurality of sub-targets disposed on the back plate, wherein all sub-targets in a given trial target structure are characterized by a same respective sub-target size, wherein the sizes of the sub-targets for the multiple trial target structures range from 5% to 75% of the second size;
    performing trial sputtering operations to determine crack characteristics for each of the multiple trial target structures; and
    identifying a threshold target size of the sub-targets, below which no cracks are formed in the sputtering operation.

3. The method of claim 1, wherein determining the threshold target size comprises:
    forming one or more trial target structures, each trial target structure comprising a plurality of sub-targets disposed on the back plate, wherein each of the plurality of sub-targets in a given trial target structure is characterized by a respective sub-target size ranging from 5% to 75% of the second size;
    performing trial sputtering operations to determine crack characteristics for each of the plurality of sub-targets; and
    identifying a threshold target size of the sub-targets, below which no cracks are formed in the sputtering operation.

4. The method of claim 1, wherein forming a sub-target comprises:

pressing powders of a ferromagnetic material including one or more of cobalt iron-boron (CoFeB) or iron-boron (FeB) to form the sub-target; and
sintering the sub-target at a selected temperature.

5. The method of claim 1, wherein the first size of the semiconductor wafer ranges from 3 inches (75 mm) to 27 inches (675 mm), and the second size being equal to or 10% greater than the first size.

6. The method of claim 1, wherein the target structure comprises a plurality of sub-targets, wherein each of the plurality of sub-targets is in direct contact with one or more adjacent sub-targets.

7. The method of claim 1, wherein the target structure comprises gaps on the back plate, each gap enclosed by two or more sub-targets.

8. The method of claim 1, wherein each of the sub-targets is characterized by a circular shape of a diameter below the threshold target size for crack formation;
wherein each of the plurality of sub-targets is in direct contact with one or more adjacent sub targets without an adhesive material between adjacent sub-targets, three adjacent sub-targets enclosing a gap region.

9. The method of claim 8, wherein the sputtering target structure further comprises a second plurality of sub-targets characterized by a diameter smaller than the selected diameter and disposed at an outer periphery of the back plate.

10. The method of claim 1, wherein the threshold target size is 1 inch (25 mm).

11. A method comprising:
providing a back plate of a sputtering target structure, the back plate characterized by a second size that is equal to or greater than a first size of a semiconductor wafer;
determining a threshold target size, the threshold target size being a fraction of the second size, wherein a given sub-target characterized by a size equal to or less than the threshold target size exhibits no crack formation in a sputtering operation;
forming a plurality of sub-targets, each of the plurality of sub-targets characterized by a size equal to or less than the threshold target size; and
bonding the plurality of sub-targets to the back plate to form a sputtering target structure.

12. The method of claim 11, wherein determining the threshold target size comprises:
forming multiple trial target structures, each trial target structure comprising a plurality of sub-targets disposed on the back plate, wherein all sub-targets in a given trial target structure are characterized by a same respective sub-target size, wherein the sizes of the sub-targets for the multiple trial target structures range from 5% to 75% of the second size;
performing trial sputtering operations to determine crack characteristics for each of the multiple trial target structures; and
identifying the threshold target size.

13. The method of claim 11, wherein determining the threshold target size comprises:
forming one or more trial target structures, each trial target structure comprising a plurality of sub-targets disposed on the back plate, wherein each of the plurality of sub-targets in a given trial target structure is characterized by a respective sub-target size ranging from 5% to 75% of the second size;
performing trial sputtering operations to determine crack characteristics for each of the plurality of sub-targets; and
identifying a threshold target size.

14. The method of claim 11, wherein forming the plurality of sub-targets comprises, for each of the plurality of sub-targets:
pressing powders of a ferromagnetic material including one or more of cobalt iron-boron (CoFeB) or iron-boron (FeB) to form the sub-target; and
sintering the sub-target at a selected temperature.

15. The method of claim 11, wherein the first size of the semiconductor wafer ranges from 3 inches to 27 inches, and the second size being equal to or 10% greater than the first size.

16. The method of claim 11, wherein each of the plurality of sub-targets is in direct contact with one or more adjacent sub-targets.

17. The method of claim 11, wherein the sputtering target structure comprises gaps on the back plate, each gap enclosed by two or more of the plurality of sub-targets.

18. The method of claim 11, wherein each of the sub-targets is characterized by a circular shape having a diameter below the threshold target size, and each of the plurality of sub-targets is in direct contact with one or more adjacent sub targets without an adhesive material therebetween.

19. A method comprising:
providing a back plate of a sputtering target structure, the back plate characterized by a second size that is equal to or greater than a first size of a semiconductor wafer;
determining a threshold target size, wherein a given sub-target characterized by a size equal to or less than the threshold target size exhibits no crack formation in a sputtering operation;
forming a plurality of sub-targets on the back plate, each of the plurality of sub-targets characterized by a size equal to or less than the threshold target size; and
bonding the plurality of sub-targets to the back plate to form a sputtering target structure.

20. The method of claim 19, wherein the threshold target size is 1 inch.

* * * * *